United States Patent [19]

Kozono

[11] Patent Number: 5,731,632
[45] Date of Patent: Mar. 24, 1998

[54] SEMICONDUCTOR DEVICE HAVING A PLASTIC PACKAGE

[75] Inventor: Hiroyuki Kozono, Omiya, Japan

[73] Assignee: Kabushiki Kaisha Toshiba, Kawasaki, Japan

[21] Appl. No.: 863,418

[22] Filed: May 27, 1997

Related U.S. Application Data

[63] Continuation of Ser. No. 647,698, May 14, 1996, abandoned.

[30] Foreign Application Priority Data

May 16, 1995 [JP] Japan .................. 7-117250

[51] Int. Cl.⁶ .................. H01L 23/36; H01L 23/40
[52] U.S. Cl. .................. 257/717; 257/707; 257/712; 257/796; 257/675
[58] Field of Search .................. 257/787, 675, 257/706, 707, 712, 717, 720, 796, 788

[56] References Cited

U.S. PATENT DOCUMENTS

| | | | |
|---|---|---|---|
| 5,041,902 | 8/1991 | McShane | 257/706 |
| 5,105,259 | 4/1992 | McShane et al. | 257/675 |
| 5,430,331 | 7/1995 | Hamzehdoost et al. | 257/675 |
| 5,440,169 | 8/1995 | Tomita et al. | 257/796 |
| 5,442,234 | 8/1995 | Liang | 257/675 |
| 5,444,025 | 8/1995 | Sono et al. | 257/796 |

FOREIGN PATENT DOCUMENTS

| | | | |
|---|---|---|---|
| 0223136 | 11/1985 | Japan | 257/720 |
| 0059843 | 3/1989 | Japan | 257/717 |
| 0151257 | 6/1989 | Japan | 257/706 |
| 0297847 | 11/1989 | Japan | 257/787 |

*Primary Examiner*—Tom Thomas
*Assistant Examiner*—Alexander Oscar Williams
*Attorney, Agent, or Firm*—Finnegan, Henderson, Farabow, Garrett & Dunner, L.L.P.

[57] ABSTRACT

A resin-sealed type semiconductor device has a bed holding a semiconductor element on one surface and is provided with a plurality of protrusions on another surface. A lead frame includes a plurality of outer leads formed integral with the corresponding one of a plurality of inner leads, a bed section, and hanging pins for supporting the bed section. Each of the plurality of inner leads is connected to the corresponding one of a plurality of electrode pads by one of bonding wires. The semiconductor element, bonding wires, inner leads, hanging pins, and bed are sealed with resin such that the one surface of the bed, on which the protrusions are formed, is exposed to the outside.

5 Claims, 4 Drawing Sheets

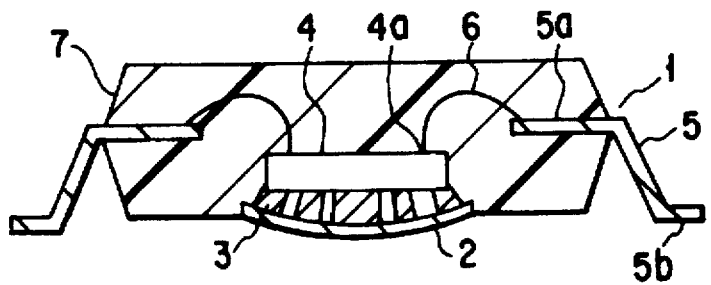
F I G. 4 (PRIOR ART)
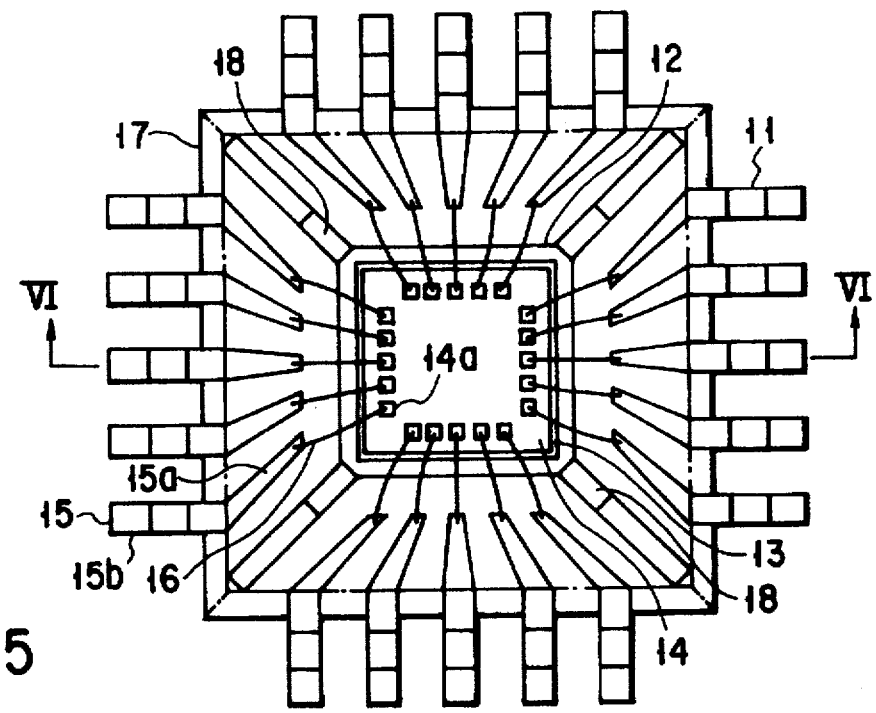
F I G. 5
F I G. 6

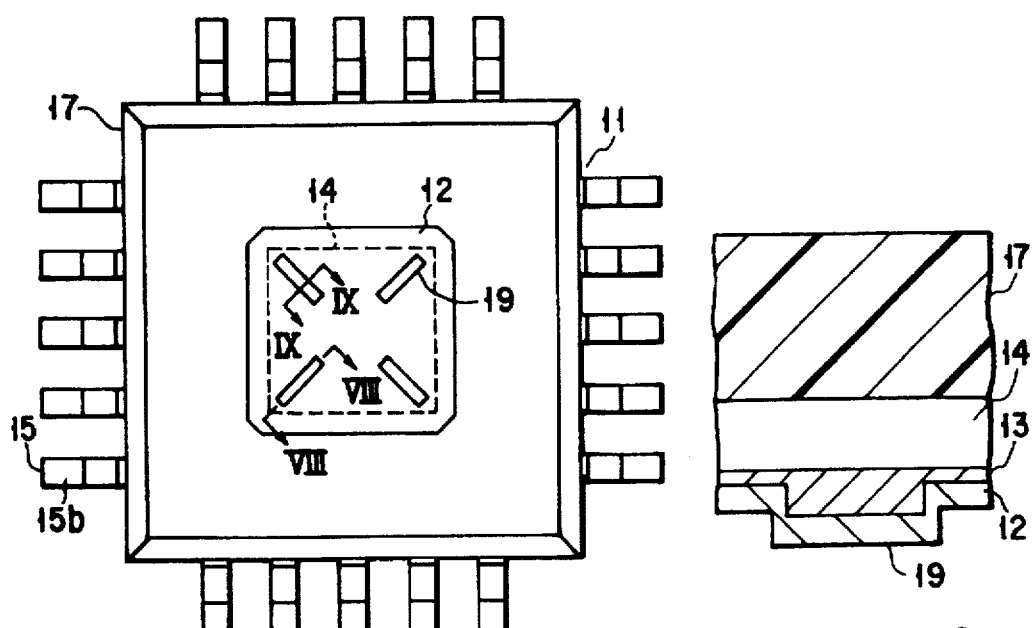
FIG. 7
FIG. 8
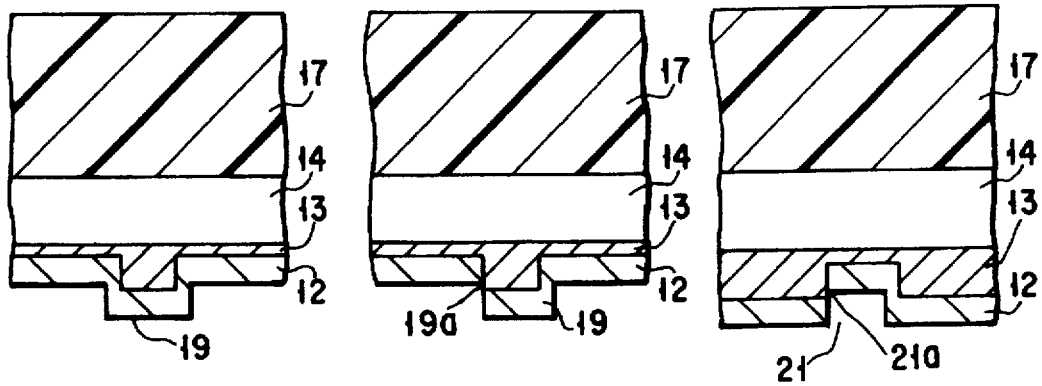
FIG. 9
FIG. 10
FIG. 11
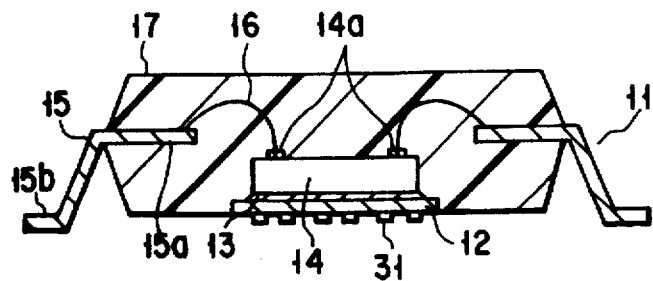
FIG. 12

SEMICONDUCTOR DEVICE HAVING A PLASTIC PACKAGE

This is a continuation of application Ser. No. 08/647,698, filed May 14, 1996 now abandoned.

BACKGROUND OF THE INVENTION

1. Field of the Invention

This invention relates to a resin-sealed semiconductor device and, in particular, to a resin-sealed type semiconductor device wherein the bed holding a semiconductor chip has one surface exposed to the outside of the plastic package.

2. Description of the Related Art

Known as a resin-sealed type semiconductor device with high heat-radiating efficiency, a bed-exposed type semiconductor device with low thermal resistance, for holding a semiconductor chip supplied with power of 1–3 W has been developed.

The bed-exposed type semiconductor device need not be provided with a heat-radiating means such as a heat spreader, and thus can be manufactured at low cost.

FIG. 1 is a plane view of the conventional bed-exposed type semiconductor device, and FIG. 2 is a sectional view of the device taken along line II—II. As shown in FIGS. 1 and 2, a semiconductor chip 4 is mounted on a bed 2 of a lead frame 1 by paste 3 such as adhesive and solder paste.

Each of the pads 4a on the semiconductor chip 4 is electrically connected to the corresponding one of inner leads 5a of leads 5 of the lead frame 1 by means of bonding wire 6.

The semiconductor chip 4 is sealed with resin 7. Each of the outer leads 5b of the lead frame 1, which extends out of the resin 7, is formed with a predetermined shape.

The bed 2 of the lead frame is pressed in advance and positioned lower than the inner leads 5a so as to be horizontally equal to one side of the resin 7 (the bottom surface, for example), as shown in FIG. 3.

The bed-exposed type semiconductor device has high heat-radiating efficiency since the bed 2 is lowered to the level of the one side of the resin 7 in this manner. However, the paste 3 may be deformed as shown in FIG. 4 due to the vapor burst occurring when the paste is moisturized or the generation of outer gas during a reflow process.

More specifically, the bed 2 is not supported by the resin 7 at the exposed surface, and the deformed paste 3 makes the surface of the bed 2 warp and protrude from the resin surface.

If the lead frame is of the type in which bed and leads are formed with a predetermined shape by etching or stamping a metal plate, the bed is conventionally supported by hanging pins at its corners. Therefore, the above-mentioned warping occurs more terribly at the portions other than the supported corners.

In the conventional device, the above-mentioned warping of the bed 2 adversely affects the mounting of the semiconductor device on the substrate.

SUMMARY OF THE INVENTION

The present invention has been developed in consideration of the above problem, and intends to provide a resin-sealed type semiconductor device wherein the warping of the bed can be suppressed and the mounting of the semiconductor device on the substrate can be improved.

In order to attain the above object, the resin-sealed type semiconductor device of the present invention comprises: a semiconductor element; a bed having one surface which supports the semiconductor element and another surface on which a plurality of protrusions; hanging pins hanging the bed from a lead frame; a plurality of inner leads connected to a plurality of electrode pads of the semiconductor element by means of bonding wires; a plurality of outer leads each formed integral with each of the plurality of inner leads; and resin sealing the bed, except the other surface on which the plurality of inner leads, the hanging pins, and the plurality of protrusions are arranged.

By virtue of the above structure, the resin-sealed type semiconductor device of the present invention can suppress the warping of the bed, and can improve the mounting of the semiconductor device on the substrate.

BRIEF DESCRIPTION OF THE DRAWINGS

FIG. 4 shows shortcomings of the conventional device shown in FIG. 1;

FIG. 5 is a partial top view showing the bed-exposed type semiconductor device of the present invention, other than the plastic package;

FIG. 6 is a sectional view of the device shown in FIG. 5 take along with a line VI—VI;

FIG. 7 is a bottom view schematically showing the device of the present invention shown in FIG. 5;

FIG. 8 is a sectional view of the device shown in FIG. 7 take along with a line VIII—VIII;

FIG. 9 is a sectional view of the device shown in FIG. 7 take along with a line IX—IX;

FIG. 10 shows an embodiment in which a cut-away portion is provided to the protruded portion shown in FIG. 7;

FIG. 11 is a sectional view of a part of the device of an embodiment in which a cut-away portion is provided to a recess portion in a bed so as to be buried in adhesive paste layer;

FIG. 12 is a sectional view of a part of the resin-sealed type semiconductor device of an embodiment in which the square protruded portions are dottedly provided on the bottom surface of the bed;

DETAILED DESCRIPTION OF THE PREFERRED EMBODIMENTS

Figure 1:
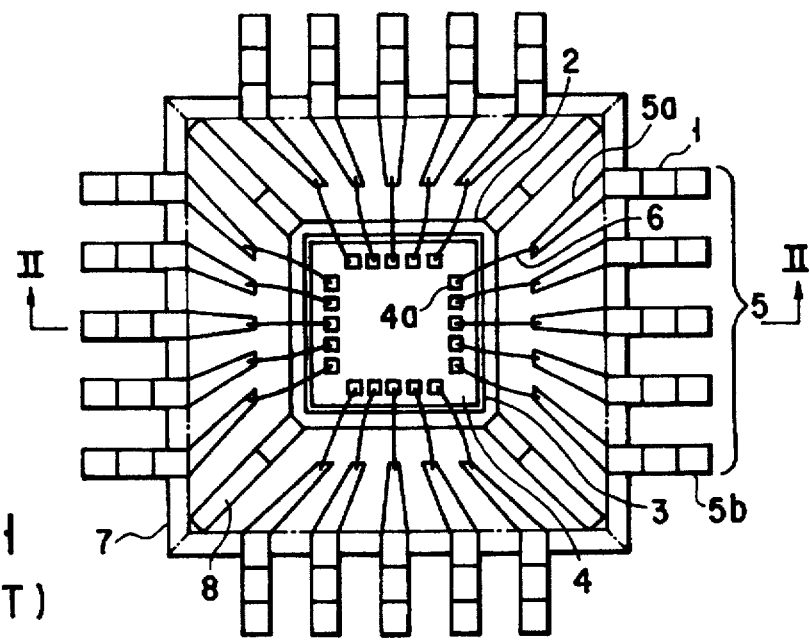
FIG. 1 is a partial top view showing the conventional bed-exposed type semiconductor device other than the plastic package.
Figure 2:
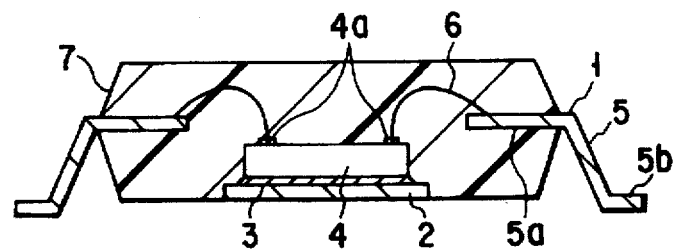
FIG. 2 is a sectional view of the conventional device shown in FIG. 1 take along with a line II—II.
Figure 3:
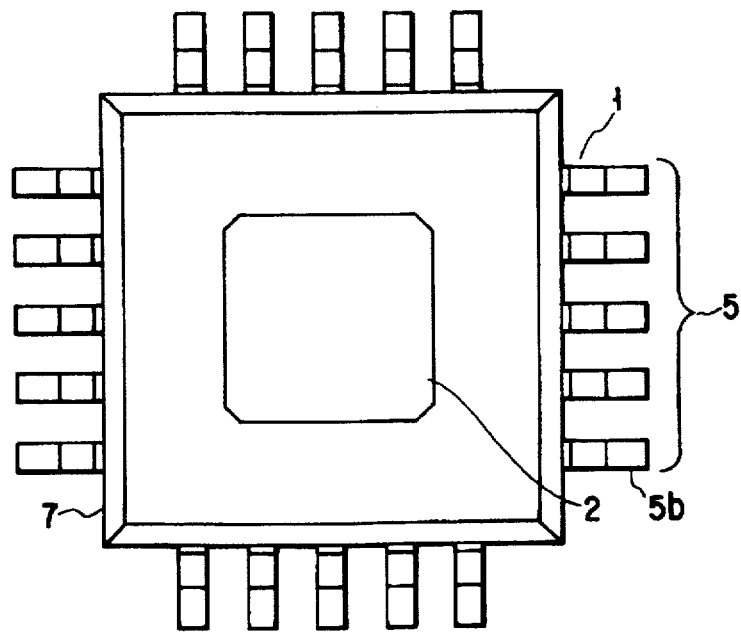
FIG. 3 is a bottom view of the conventional device shown in FIG. 1.

The present invention will be more specifically described below with reference to the accompanying drawings.

FIG. 5 is a partial top view showing a schematic structure of the bed-exposed resin-sealed type semiconductor device of an embodiment of the present invention, other than the plastic package.

FIG. 6 is a sectional view of the device shown in FIG. 5 take along with a line VI—VI.

In this resin-sealed type semiconductor device, a semiconductor chip 14 is mounted on a bed of a lead frame 11 by paste 13 such as adhesive and solder paste.

Each of electrode pads 14a on the semiconductor chip 14 is electrically connected to the corresponding one end of inner leads 15a of leads 15 of the lead frame 11 by means of bonding wire 16.

The semiconductor chip 14 and the inner leads 15a of the leads 15 of the lead frame 11 are sealed with resin 17, and the extending portions of the inner leads 15a extend to the outside of the resin as outer leads 15b. The extending outer leads 15b are formed in predetermined shapes, respectively.

The resin 17 seals the semiconductor chip so as to provide a bed-exposed type semiconductor device in which the bottom surface of the bed 12 of the lead frame 11 is exposed to the outside and is horizontally equal to the bottom surface of the package.

The lead frame 11 is formed by etching or stamping a metal plate or the like, and comprises a square bed 12 and the plurality of leads 15 having the plurality of inner leads 15a and outer leads 15b surrounding the bed 12.

The lead frame 11 is also formed such that the corners of the lead frame 11 are supported by hanging pins 18, and the leads 15 are formed integral with the outer frame of the lead frame 11 so as to be connected to each other by means of the outer frame.

The outer lead frame is removed after the outer leads 15b are formed, thereby the outer leads 15b are separated from each other.

The bed 12 of the lead frame 11 is pressed lower than the inner leads 15a of the leads 15 in advance such that one side surface of the bed 12 is exposed to the outside on the same plain of the bottom surface of the sealed resin 17 when the device is sealed.

The protrusions 19 on the bottom of the sealed package can be easily formed by the method such as employing a metallic mold on which the protrusions corresponding to the protrusions 19 are formed. Therefore, the setting portion and the number of the protrusions 19 to be provided on the one surface of the bed 12 can be set as desired.

FIG. 7 is a bottom view schematically showing the bed-exposed resin-sealed type semiconductor device of the present invention.

In this drawing, the bed 12 to which one side surface of the resin 17 is exposed is provided with the protrusions 19 at its four corner. In this case, each of the protrusions 19 formed with a rectangular shape is arranged along with one of the diagonal lines of the bed 12 which is supported by hanging pins 18, and located at the corner of the bed 12.

FIG. 8 is a sectional view of the device shown in FIG. 7 take along with a line VIII—VIII, and FIG. 9 is a sectional view of the device shown in FIG. 7 take along with a line IX—IX.

The protrusions 19 have longer sides along with one of the diagonal lines and shorter sides perpendicular to the one of the diagonal lines. By forming the protrusions 19, the mechanical strength of protrusions 19 can be lessened to make the mechanical strength of the entire bed 12 to be uniform.

By providing the protrusions 19 having not so large mechanical strength to each of the corners of the bed 12 in the above-mentioned manner, the mechanical strength of the corners of the bed 12 decreases to be equal to that of the other portions, and thus the warping of the bed 12 due to the supporting of the hanging pins 18 at the corners of the bed 12 can be suppressed. As a result, the bed 12 cannot be bent so much even if the paste 13 is deformed, and the level of the outer leads 15b can be prevented from being extremely lowered than that of the exposed surface of the bed 12.

In this manner, according to the present invention, the problem that the warping of the bed adversely affects the mounting of the semiconductor device on the substrate and decreases the reliability of the device can be solved.

This structure is also advantageous in thermal characteristics since the bed surface is wholly exposed to the outside of the resin as in the conventional device and the high efficiency in the thermal characteristics of this type of device is not adversely affected.

The above embodiment relates to the case in which the bottom surface of the bed is provided with the protrusions, but the present invention is not limited to the above-mentioned case. The same advantages can be obtained when the bottom surface of the bed is provided with recesses formed to be directed to the paste.

As modifications, a cutaway portion 19a on the side wall of the protrusions 19 can be formed as shown in FIG. 10, or as shown in FIG. 11, the bed 12 may be provided with a recess 21 formed to be directed from the non-mounting surface of the bed 12 to the chip-mounting surface of the bed 12, in which a cutaway portion 21a on a side wall of the recess.

When the protrusion 19 or the recess 21 is provided with the cutaway portion 19a or 21a, the vapor or outer gas generated from the paste 13 can be discharged to the outside of the device from the cutaway portion, with the result that not only the warping of the bed 12, but also the deformation of the paste 13 due to the vapor burst or outer gas which causes the warping of the bed can be suppressed.

If the bed 12 is merely perforated to discharge the vapor or outer gas generated from the paste, the thermal radiation area is decreased. However, according to the above embodiment, a part of the protrusion 19 or recess 21 is cut away, the area of the bed 12 is not decreased and the thermal resistance is not deteriorated.

The maximum thickness of the paste 13 is determined by the size of cutaway portions 19a or 21a, and the maximum thickness of the paste 13 can be arbitrarily set by adjusting the pressing for forming the protrusion 19 or recess 21.

Figure 13:
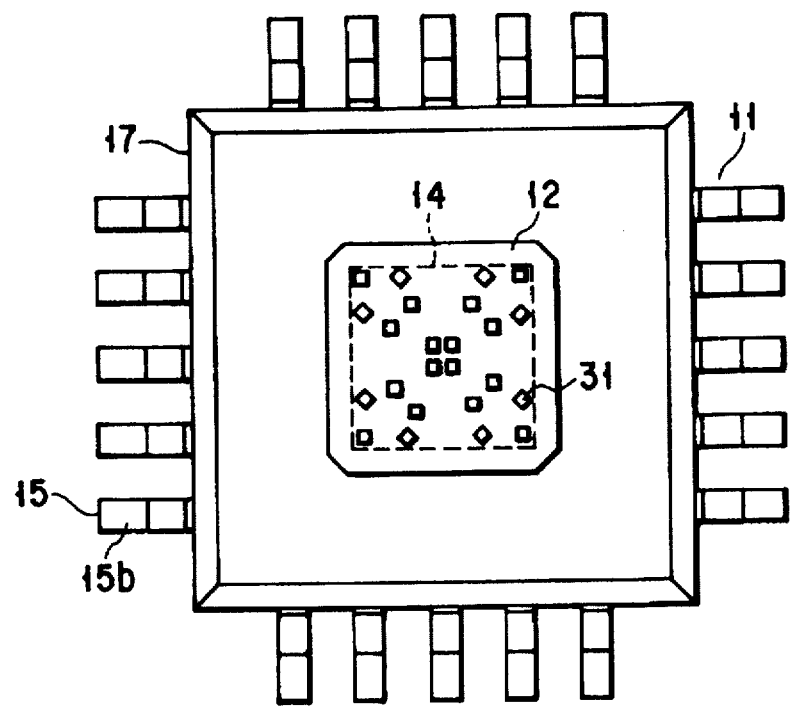
FIG. 13 is a plain view of the bottom surface of the bed in the embodiment shown in FIG. 12.

As is clear from the sectional view of FIG. 12 and a plain view of FIG. 13, for example, the shape of the protrusions is not limited to the rectangular form, but square-shaped protrusions (or recesses) 31 can be dottedly formed on the bottom surface of the bed 12. In this case, a plurality of protrusions (or recess) 31 are arranged on concentric circles having a central portion as a center such that the density of the protrusions increases nearer to the diagonal lines.

Figure 14:
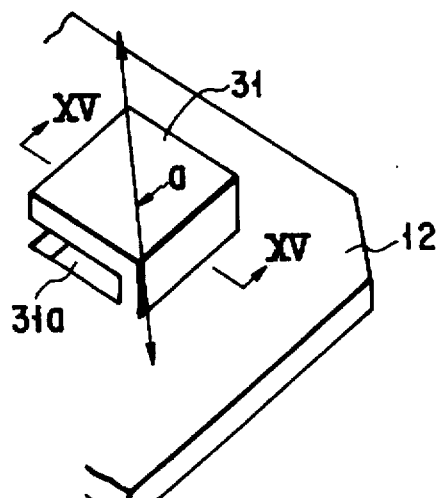
FIG. 14 is a perspective view in which a cut-away portion is provided to one of the protruded portions shown in FIG. 13.

In each of the protrusions 31, as shown in FIG. 14, the opening 31a is formed on the side wall of the bed 12. By forming the opening, the thermal resistance is not decreased and the vapor or outer gas generated in the paste can be discharged to the outside.

Figure 15:
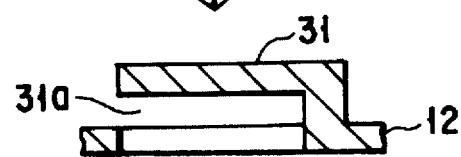
FIG. 15 is a sectional view of the protruded portion shown in FIG. 14 take along with a line XV—XV.

The opening 31a can suppress the warping of the bed 12 in the direction shown by arrows, and the deformation of the bed can be prevented. FIG. 15 is a sectional view of the protruded portion shown in FIG. 14 take along with a line XV—XV to enlarge the cutaway portion 31a.

It is further understood by those skilled in the art that the foregoing description is only of the preferred embodiments and that various changes and modifications may be made in the invention without departing from the spirit and scope thereof.

What is claimed is:

1. A resin-sealed type semiconductor device comprising:
   a semiconductor element having a plurality of electrode pads;
   an adhesive layer having a first surface formed on the semiconductor element and a second surface having a plurality of protrusions;
   a lead frame comprising:
      a bed having a first surface formed on the second surface of the adhesive layer, wherein the adhesive layer connects the semiconductor element to the bed, a second surface of the bed has a plurality of protrusions extending from portions of the second surface of the bed, and each of the plurality of protrusions of the bed aligns with a corresponding protrusion of the adhesive layer,
      a plurality of inner leads, each of the inner leads being connected to a corresponding one of the plurality of electrode pads of the semiconductor element by bonding wires,
      a plurality of outer leads, each of the outer leads being integral with a corresponding one of the inner leads, and
   hanging pins for supporting the bed; and
   a resin for sealing the semiconductor element, the adhesive layer, and the lead frame such that the plurality of protrusions of the bed are exposed.

2. A resin-sealed type semiconductor device according to claim 1, wherein the bed has a substantially square shape, and each of the protrusions of the bed have a substantially rectangular surface and are substantially arranged at corners of the bed on diagonal lines of the bed, the plurality of protrusions of the bed causing a mechanical strength of the corners of the bed to equate to a mechanical strength of other portions of the bed.

3. A resin-sealed type semiconductor device according to claim 1, wherein the plurality of protrusions of the bed extend from the second surface of the bed to the outside.

4. A resin-sealed type semiconductor device according to claim 1, wherein a part of each of the plurality of protrusions of the bed has a cutaway portion, such that a gas generated by the adhesive layer is discharged to the outside through the cutaway portions.

5. A resin-sealed type semiconductor device according to claim 1, wherein the plurality of protrusions of the bed are arranged on concentric circles having a central portion on the second surface of the bed such that a density of the plurality of the protrusions of the bed increases nearer to diagonal lines of the bed.

* * * * *